(12) United States Patent
Yoshimura

(10) Patent No.: US 9,762,787 B2
(45) Date of Patent: Sep. 12, 2017

(54) IMAGE PICKUP APPARATUS HAVING AUTO-FOCUSING FUNCTION AND ITS CONTROL METHOD

(71) Applicant: CANON KABUSHIKI KAISHA, Tokyo (JP)

(72) Inventor: Yuki Yoshimura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/911,689

(22) Filed: Jun. 6, 2013

(65) Prior Publication Data
US 2013/0342751 A1 Dec. 26, 2013

(30) Foreign Application Priority Data

Jun. 25, 2012 (JP) .................................. 2012-142083

(51) Int. Cl.
*G03B 13/00* (2006.01)
*H04N 5/232* (2006.01)
(Continued)

(52) U.S. Cl.
CPC ... *H04N 5/23212* (2013.01); *H01L 27/14627* (2013.01); *H04N 5/3696* (2013.01)

(58) Field of Classification Search
CPC .............. H04N 5/217; H04N 5/23212; H04N 5/23209; H04N 5/772; H04N 5/3872; H04N 5/907
(Continued)

(56) References Cited

U.S. PATENT DOCUMENTS

2008/0239099 A1* 10/2008 Abe .......................... 348/231.99
2008/0258039 A1 10/2008 Kusaka
(Continued)

FOREIGN PATENT DOCUMENTS

CN 1865843 A 11/2006
JP 04-267211 A 9/1992
(Continued)

OTHER PUBLICATIONS

Feb. 2, 2016 Chinese Office Action, a copy of which is unclosed with an English Translation, that issued in Chinese Patent Application No. 201310253498.8.
(Continued)

*Primary Examiner* — Antoinette Spinks
(74) *Attorney, Agent, or Firm* — Cowan, Liebowitz & Latman, P.C.

(57) ABSTRACT

An image pickup apparatus including an image pickup unit for outputting image signals obtained by respectively photoelectrically converting light passing through different exit pupil areas of a focusing optical system, and a setting unit for setting a focus detection area into an image pickup area of the image pickup unit, stores at least one approximate function for calculating correction values of the image signals obtained by the image pickup unit in an approximation manner, obtains an approximate function effective for the correction at least in the focus detection area set by the setting unit on the basis of at least the one stored approximate function to calculate a correction value in accordance with the obtained approximate function; and performs a focus detection by using the image signals obtained by the image pickup unit and the calculated correction values.

22 Claims, 12 Drawing Sheets

(51) Int. Cl.
*H04N 5/369* (2011.01)
*H01L 27/146* (2006.01)

(58) Field of Classification Search
USPC .................................. 348/231.99, 241, 349
See application file for complete search history.

(56) References Cited

U.S. PATENT DOCUMENTS

2011/0164166 A1\* 7/2011 Oikawa .................. 348/340
2012/0147227 A1\* 6/2012 Yoshimura et al. .......... 348/246

FOREIGN PATENT DOCUMENTS

| JP | 2003-241075 A | 8/2003 |
| JP | 2008-252522 A | 10/2008 |
| JP | 2011-114553 A | 6/2011 |

OTHER PUBLICATIONS

Mar. 15, 2016 Japanese Office Action, a copy of which is enclosed an English Translation, that issued in Japanese Patent Application No. 2012142083.

\* cited by examiner

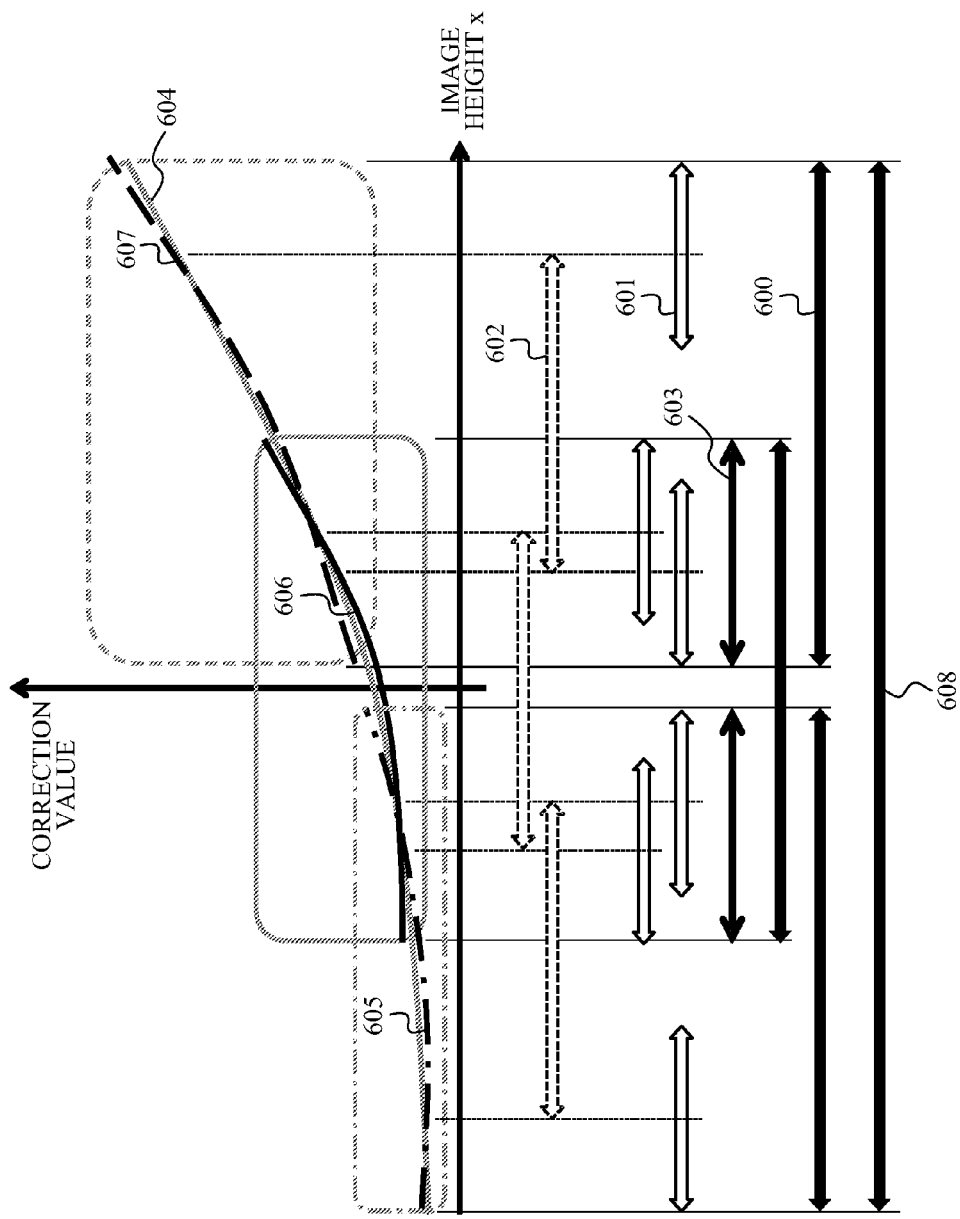

IMAGE PICKUP APPARATUS HAVING AUTO-FOCUSING FUNCTION AND ITS CONTROL METHOD

BACKGROUND OF THE INVENTION

1. Field of the Invention

The present invention relates to an image pickup apparatus such as an electronic camera or the like and, more particularly, to an image pickup apparatus having an auto-focusing function and a control method of such an apparatus.

2. Description of the Related Art

The Official Gazette of Japanese Patent Application Laid-Open No. H04-267211 discloses a solid-state image pickup apparatus in which an image pickup element constructed by two-dimensionally arranging a number of microlenses and pixels in each of which a relative position of a photoelectric conversion unit is deviated with respect to an optical axis of the microlens also has a function of a focus detection element. In the solid-state image pickup apparatus of Japanese Patent Application Laid-Open No. H04-267211, in a case where a normal photographing is performed, an image is generated by adding signals of the pixels whose relative deviation directions to the microlens differ. In a case where a focus position of a photographing lens is calculated, by executing a correlation operation by using a pair of image signals generated respectively by pixel lines in which the relative deviation directions of the photoelectric conversion units to the microlens are different from each other, the focus position of the photographing lens is calculated.

At the time of photographing, there is a case where what is called vignetting in which a part of a light flux which is irradiated toward a group of focus detecting pixels is shielded by a photographing optical system (including optical elements such as lenses, iris, and the like and a lens barrel for holding them) occurs. The occurrence of the vignetting causes an unevenness of intensity of the image signals due to a decrease in light amount (unevenness of light receiving sensitivity of each focus detecting pixel: hereinbelow, referred to as "shading") in at least one of the pair of generated image signals. There is a case where such a decrease in image signal level and a shading occurring due to the vignetting reduce a degree of coincidence of the pair of generated image signals and decrease a precision of focus detection.

To prevent such a problem, therefore, the Official Gazette of Japanese Patent Application Laid-Open No. 2011-114553 discloses such a technique that a shading of a pair of image signals obtained from a pixel group for receiving light fluxes passing through different exit pupil areas of a photographing optical system is corrected based on image pickup pixel signals.

The Official Gazette of Japanese Patent Application Laid-Open No. 2008-252522 also discloses such a technique that plots of an image height and a distorted aberration amount of an image pickup element are stored and an approximate function is derived from their values, thereby performing a distortion crosswise difference correction in which a necessary amount of data is suppressed.

In order to perform a good focus detection, it is necessary to perform the correction of the shading at a high precision. However, there is such a problem that if the shading correction is performed at a high precision, an operation scale increases and it takes a time for an operation processing.

SUMMARY OF THE INVENTION

It is, therefore, an aspect of the invention to realize an image pickup apparatus in which an operation scale is decreased and a shading correction of a high precision can be performed.

According to the invention, an image pickup apparatus comprises: an image pickup unit configured to output image signals obtained by respectively photoelectrically converting light passing through different exit pupil areas of a focusing optical system; a setting unit configured to set a focus detection area in an image pickup area of the image pickup unit; a storing unit configured to store at least one approximate function for calculating correction values of the image signals obtained by the image pickup unit in an approximation manner; a correction value calculating unit configured to obtain an approximate function effective for the correction at least in the focus detection area set by the setting unit on the basis of at least the one approximate function stored in the storing unit and calculate a correction value in accordance with the obtained approximate function; and a focus detection unit configured to perform a focus detection by using the image signals obtained by the image pickup unit and the correction values calculated by the correction value calculating unit.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 6A and 6B are diagrams for describing a dividing method in a focus detection direction in the case where correction value calculation coefficients according to a divided area are stored in the first embodiment of the invention.

DESCRIPTION OF THE EMBODIMENTS

Various exemplary embodiments, features, and aspects of the present invention will be described in detail below with reference to the drawings.

The embodiments of the invention will be described in detail hereinbelow with reference to the drawings.

First Embodiment

The first Embodiment of the invention will be described with reference to FIGS. 1 to 9.

Construction of Focus Detecting Apparatus

Figure 1:
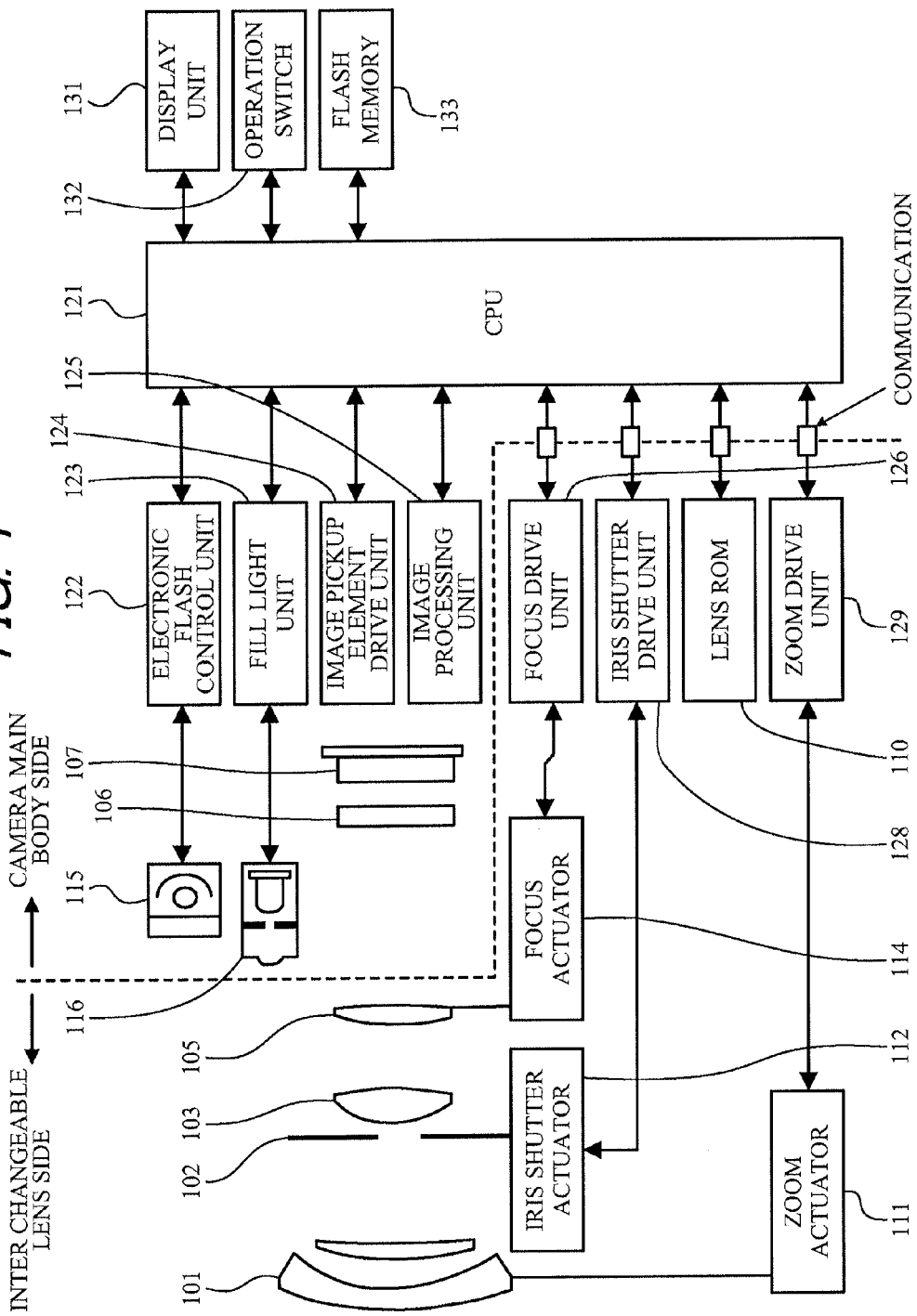
FIG. 1 is a constructional diagram of an image pickup apparatus according to an embodiment of the invention.

FIG. 1 illustrates a constructional diagram of an image pickup apparatus having a focus detecting apparatus to which the embodiment is applied.

In FIG. 1, a first lens group 101 arranged at a front edge of a photographing lens (focusing optical system) is held so as to be movable backward and forward in an optical axis direction.

A shutter also serving as an iris (hereinbelow, referred to as an iris shutter) 102 performs a light amount adjustment upon photographing by adjusting an aperture diameter and also has a function as a shutter for adjusting an exposure time upon photographing of a still image.

A second lens group 103 of the photographing lens is provided. The iris shutter 102 and the second lens group 103 integratedly move backward and forward in the optical axis direction and effect a magnification function (zoom function) in an interlocking relational manner with the backward/forward operation of the first lens group 101.

A third lens group 105 of the photographing lens is held so as to be movable backward and forward in the optical axis direction in order to adjust a defocus amount.

An optical low-pass filter 106 is an optical element for reducing a false color and a moire of the photographed image.

An image pickup element 107 is constructed by a C-MOS sensor and its peripheral circuits. The image pickup element is a two-dimensional single-plate color sensor in which primary color mosaic filters of a Bayer array are formed on a photosensitive pixel array of (m pixels in the lateral direction)×(n pixels in the vertical direction) in an on-chip manner.

Lens information which is necessary for focus detection or the like is stored in a lens ROM 110 for every interchangeable lens. The lens ROM 110 communicates with a CPU 121. An exit pupil distance as a part of the lens information is stored in the lens ROM.

An iris shutter actuator 112 controls the aperture diameter of the iris shutter 102 to thereby adjust a photographing light amount and controls the exposure time upon photographing of the still image.

A focus actuator 114 drives the third lens group 105 so as to be movable backward and forward in the optical axis direction, thereby adjusting the defocus amount.

The CPU 121 makes various kinds of control of the main body of a focus detecting apparatus. The CPU 121 has an arithmetic operating unit, a ROM, a RAM, an A/D converter, a D/A converter, a communication interface circuit, and the like. On the basis of a predetermined program stored in the ROM, the CPU 121 drives each unit held in the focus detecting apparatus and executes a series of operations such as focus detection, photographing, image processing, recording, and the like. For example, functions of a correction value calculating unit 121a, a correction value calculation coefficient storing unit 121b, a focus detection area setting unit 121c, and a focus detection unit 121d, which will be described hereinafter, are realized by arithmetic operation processings of the CPU 121.

An image pickup element drive unit 124 controls the image pickup operation of the image pickup element 107, A/D converts obtained image signals, and transmits to the CPU 121.

A focus drive unit 126 drives the focus actuator 114 on the basis of a focus detection result and drives the third lens group 105 so as to be movable backward and forward in an optical axis direction, thereby adjusting the defocus amount.

An iris shutter drive unit 128 drives the iris shutter actuator 112 and controls an aperture of the iris shutter 102.

A zoom drive unit 129 drives a zoom actuator 111 in accordance with the zooming operation of the photographer.

Structure of Image Pickup Element

Figure 2A:
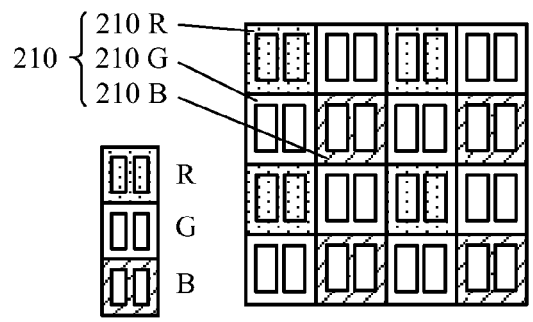
FIGS. 2A, 2B and 2C are diagrams illustrating a structure of a pixel of an image pickup element which is used in the image pickup apparatus of FIG. 1.
Figure 2B:
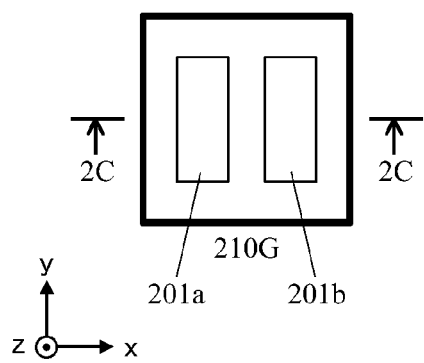
Figure 2C:
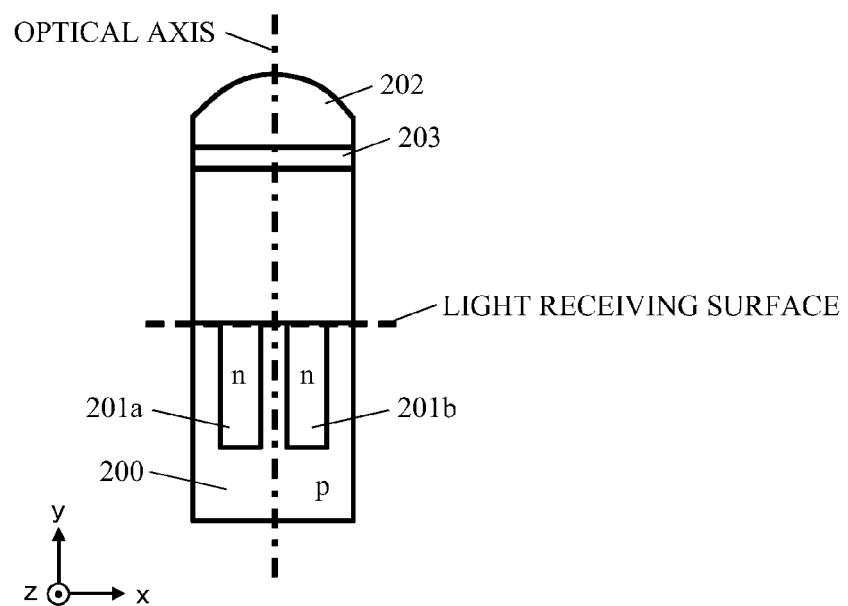

A schematic diagram of a pixel array of the image pickup element 107 is illustrated in FIG. 2A. The image pickup element 107 according to the present embodiment is a two-dimensional CMOS sensor. FIG. 2A illustrates its pixel array by a pixel range of (4 rows×4 columns). A pixel group 210 of (2 rows×2 columns) illustrated in FIG. 2A uses a Bayer array in which pixels 210G having a spectral sensitivity of G are arranged as two pixels in the diagonal direction and a pixel 210R having a spectral sensitivity of R and a pixel 210B having a spectral sensitivity of B are arranged as other two pixels. Each of the pixels 210R, 210G, and 210B is constructed by two sub pixels 201a and 201b for pupil division. Therefore, even in any pixel, the image pickup element 107 can be used not only as an image pickup element but also a focus detection element. FIG. 2B enlargedly illustrates the image pickup element 210G among the image pickup elements shown in FIG. 2A. FIG. 2C is a cross sectional view of the image pickup element 210G taken along the line 2C-2C in FIG. 2B.

In the present embodiment, a case where the sub pixels for pupil division in all of the pixels in the image pickup area are arranged and all of the pixels can be used as focus detection elements will be described. As for a rate of the pixels which can be pupil-divided and can be used as focus detection elements, such pixels can be also arranged only on a part of the sensor surface.

Concept of Pupil Division Situation of Image Pickup Element

Figure 3:
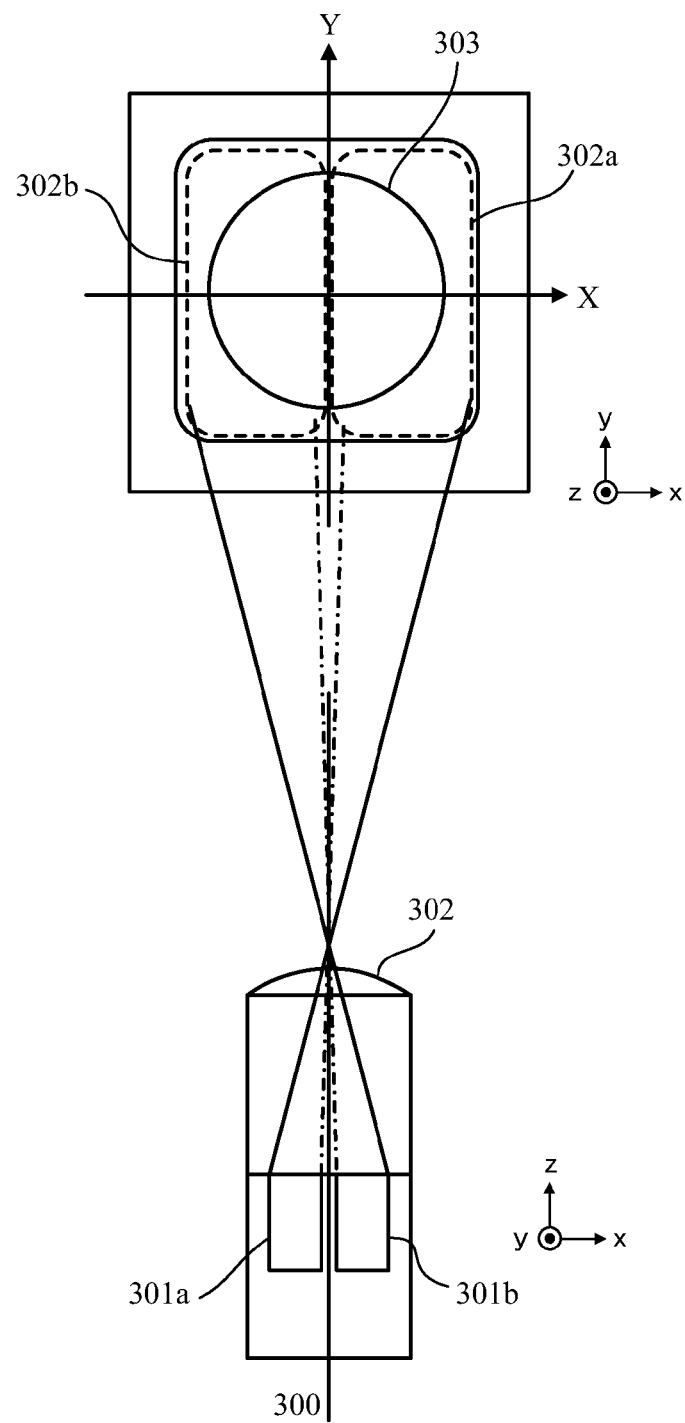
FIG. 3 is a diagram for describing a concept of a pupil division.

FIG. 3 conceptually illustrates the pupil division by one pixel. As illustrated in FIG. 3, n-type layers 301a and 301b are formed in one pixel so as to be contained in a p-type layer 300, thereby constructing two sub pixels. The two sub pixels are decentered in the +x and −x directions for the optical axis of a microlens 303. Therefore, the pupil division can be performed by using one microlens 303. A pupil 302a of an image signal A and a pupil 302b of an image signal B are illustrated.

The sub pixels 201a are regularly arranged in the x direction as illustrated in FIG. 2A and a first image signal obtained by those sub pixels 201a is assumed to be denoted by the image signal A (one of the image signals which are obtained from a pair of light fluxes passing through the different exit pupil areas of the focusing optical system). Likewise, the sub pixels 201b are also regularly arranged in the x direction as illustrated in FIG. 2A and a second image signal obtained by those sub pixels 201b is assumed to be denoted by the image signal B (the other one of the image signals which are obtained from the pair of light fluxes passing through the different exit pupil areas of the focusing optical system). By calculating a defocus amount from a relative image shift amount between the image signals A and B by using a correlation operation, a focus position of the photographing lens can be calculated. On the basis of the focus position, a defocus amount of the photographing lens is adjusted. Although the construction corresponding to an object having luminance distribution in the x direction is described here, by also expanding a similar construction to the y direction, a construction also corresponding to an object having luminance distribution in the y direction can be obtained.

Although the example in which the two decentered sub pixels are divisionally arranged in one pixel only in the one-dimensional direction in order to perform the pupil division is shown in the present embodiment, with respect to a pupil dividing method, sub pixels divided in the two-dimensional directions of the x and y directions may be formed.

Although the example in which a plurality of sub pixels are arranged per microlens in order to perform the pupil division is shown in the embodiment, with respect to a pupil dividing method, it is also possible to construct in such a manner that one decentered pixel is arranged per microlens, a pupil division is performed by using a pixel having a different eccentricity, and a focus detection is performed.

Shading

Figure 4A:
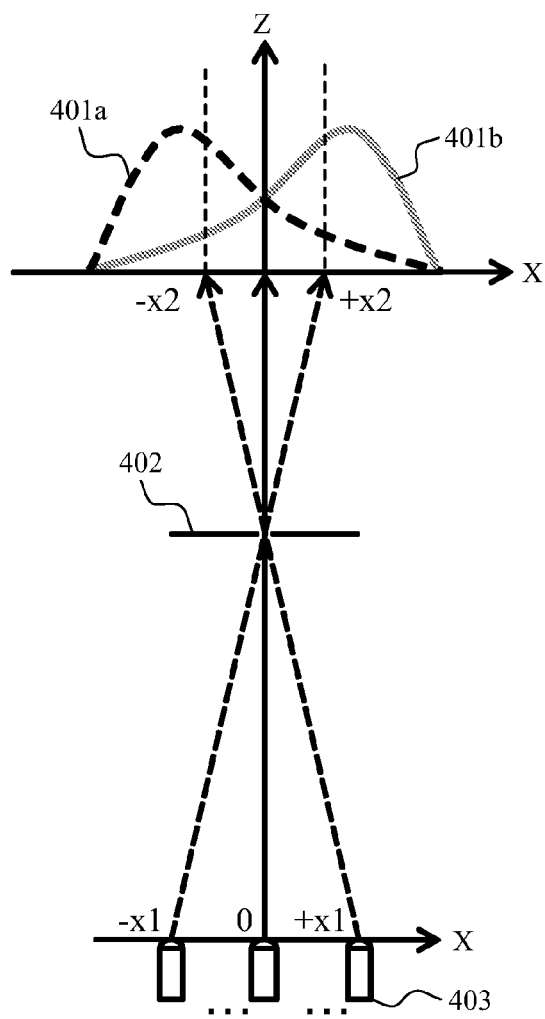
FIGS. 4A and 4B are diagrams conceptually illustrating a principle of occurrence of a shading.
Figure 4B:
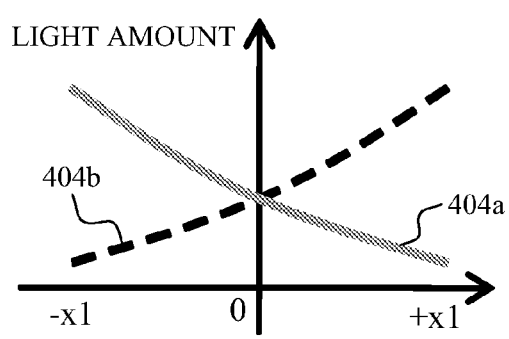

FIGS. 4A and 4B are diagrams for describing a principle of occurrence of the shading and the shading which occurs. In the diagrams, pupil intensity distribution 401a of the image signal A, pupil intensity distribution 401b of the image signal B, an iris frame 402, and a pixel 403 of each image height are illustrated, respectively. A shading 404a of the image signal A in the state of FIG. 4A and a shading 404b of the image signal B in the state of FIG. 4A are illustrated, respectively.

In the case of FIG. 4A, as for the pixel 403 having the image height of −x1, a pupil at a position of +x2 on a pupil coordinate is seen through the iris frame 402. Therefore, when comparing the sensitivities of the image signals A and B with reference to the pupil intensity distribution 401a and 401b in FIG. 4A, it will be understood that the sensitivity of the image signal B is better. On the contrary, as for the pixel 403 having the image height of +x1, a pupil at a position of −x2 on the pupil coordinate is seen through the iris frame 402. Therefore, when comparing the sensitivities of the image signals A and B, it will be understood that the sensitivity of the image signal A is better.

Due to the reasons as mentioned above, the shading in a state as illustrated in FIG. 4A becomes as illustrated in FIG. 4B. As will be understood with reference to FIG. 4A, since the shading has such a nature that it changes in accordance with the position and size of the iris frame 402, if the exit pupil distance and the iris value change, the shading also changes.

Besides the iris frame 402, a deviation of the pupil position can be also mentioned as a factor of the shading change. When considering fabrication tolerance of the image pickup element, there is such a problem that the positional relations between the sub pixels 201a and 201b serving as photoelectric conversion units and a microlens 202 are deviated in a translation direction or the optical axis direction, or the like. Since the pupil position is also deviated in the translation direction or the optical axis direction, a pupil divided area is deviated from the set pupil position to the translation direction or the optical axis direction.

Approximation Precision of Shading Correction

As will be understood by referring to FIG. 4B, since the shading has a value which changes continuously in accordance with the image height, it can be expressed as a function an image height. Therefore, the correction value of the shading can be also expressed as an image height a function of an image height. The shading changes in accordance with not only the image height as mentioned above but also a combination of the iris value and the exit pupil distance. Therefore, in the case of performing the shading correction by a lens interchangeable camera or the like, if the user tries to store all correction values, a large amount of memory capacity is necessary. As one of methods of solving such a problem, a method whereby the correction value of the shading is previously calculated for every condition (combination of the iris value and the exit pupil distance information) to obtain its approximate function, and only coefficients of the approximate function are stored can be used. In the embodiment, the approximate function is stored by the method of storing the coefficients of the approximate function.

Figure 5:
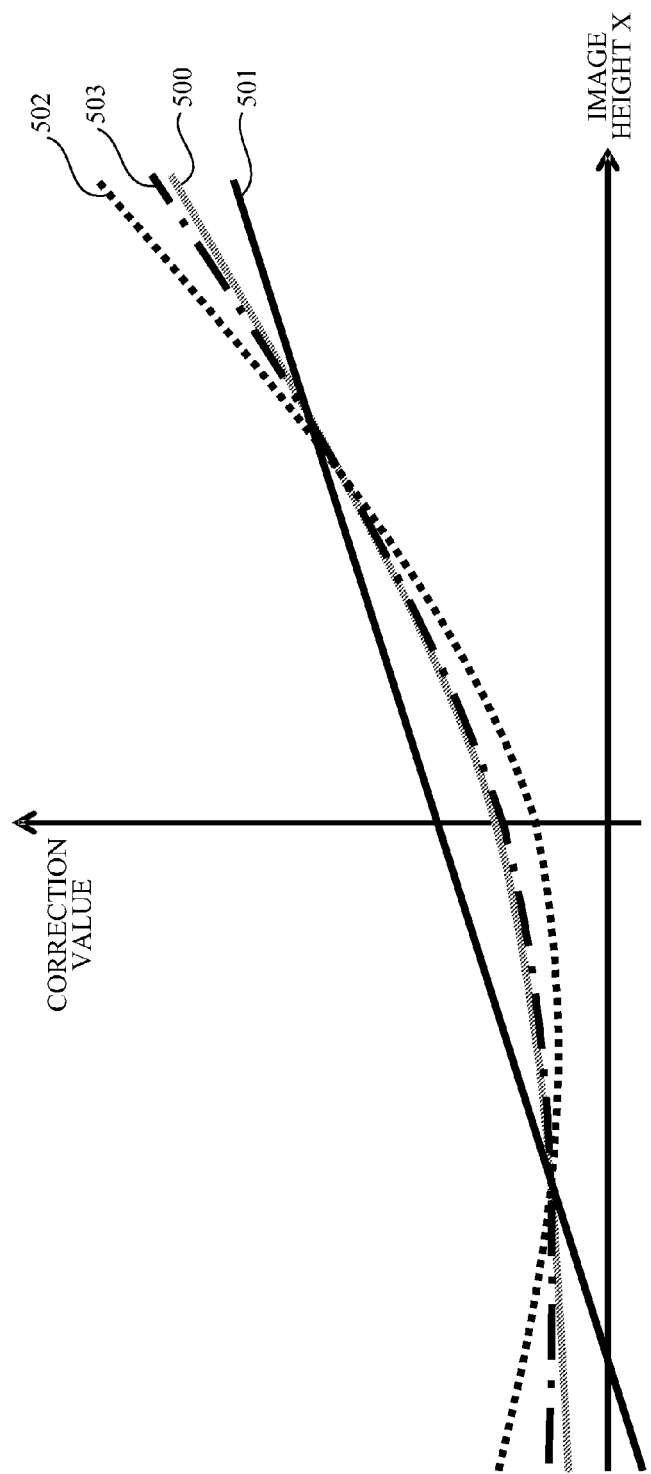
FIG. 5 is a diagram illustrating a state where an approximation precision of a correction value changes in dependence on an approximation order.

FIG. 5 illustrates a relation between the approximation order and the approximation precision at the time when the correction value of the shading of one of the pair of image signals A and B is expressed as a function an image height. In the diagram, raw data 500 of the correction value of the shading before the approximation is performed and a correction value 501 of the shading calculated by first-order approximating the raw data 500 are shown. A correction value 502 of the shading calculated by second-order approximating the raw data 500 and a correction value 503 of the shading calculated by third-order approximating the raw data 500 are shown. As mentioned above, the raw data 500 is a correction value calculated for every combination of the iris value and the exit pupil distance information. Therefore, the correction values obtained by the approximation also reflect the combination of the iris value and the exit pupil distance information.

As will be understood by referring to FIG. 5, the larger the approximation order is, the higher the approximation precision to the raw data is. Therefore, the shading can be corrected at a higher precision. However, if the order number is large, an amount of arithmetic operation increases eventually. Thus, a scale of a circuit for making the correction enlarges and this results in an increase in costs. Correction values SA(x) and SB(x) of the shading of the image signals A and B in the case of second-order approximate expressions are calculated by the following equations (1) and (2). Correction values SA(x) and SB(x) of the shading of the image signals A and B in the case of third-order approximate expressions are calculated by the following equations (3) and (4).

$$SA(x)=S0A+S1A\cdot x+S2A\cdot x^2+S3A\cdot y^2 \qquad (1)$$

$$SB(x)=S0B+S1B\cdot x+S2B\cdot x^2+S3B\cdot y^2 \qquad (2)$$

$$SA(x)=S0A+S1A\cdot x+S2A\cdot x^2+S3A\cdot y^2+S4A\cdot x^3+S5A\cdot x\cdot y^2 \qquad (3)$$

$$SB(x)=S0B+S1B\cdot x+S2B\cdot x^2+S3B\cdot y^2+S4B\cdot x^3+S5B\cdot x\cdot y^2 \qquad (4)$$

where, S0A, S1A, S2A, S3A, S4A, and S5A denote coefficients of the approximate function for calculating the correction values of the shading for the image A, and S0B, S1B, S2B, S3B, S4B, and S5B denote coefficients of the approximate function for calculating the correction values of the shading for the image B, respectively. In a case of the structure of the image pickup element in the embodiment, since the structure in the y direction is substantially symmetrical with respect to the origin, the approximate function has symmetry of an even function with respect to y.

As will be understood by comparing the equations (1) and (3), in the case of increasing the approximation order from second-order to third-order, the number of times of multiplication is increased to two or more times. A scale of a circuit necessary for an arithmetic operation enlarges extremely and an operation time also becomes long.

When the focus detection is performed, the higher the correction precision is, the higher the focus detection precision is. It is, therefore, necessary to raise the correction precision as high as possible. However, in order to raise the correction precision, it is necessary to increase the approximation order and an arithmetic operation scale enlarges, so that this results in an increase in costs. If the operation scale enlarges, the operation time becomes long and the focus detection time also becomes long. Therefore, there is a relation of trade-off between the correction precision and the operation scale.

Image Height Division of Correction Value Calculation Coefficient

Therefore, as a method of raising the correction precision without enlarging the operation scale, a method whereby the approximate area is divided and the approximation is performed by a function of a lower order is considered. This is because if the approximate area is limited, an approximation precision that is partially effective for the correction can be obtained. In the present embodiment, a case where by limiting the effective range of approximation, a correction precision similar to that of the third-order approximate function is realized by a second-order approximate function is shown.

Figure 6B:
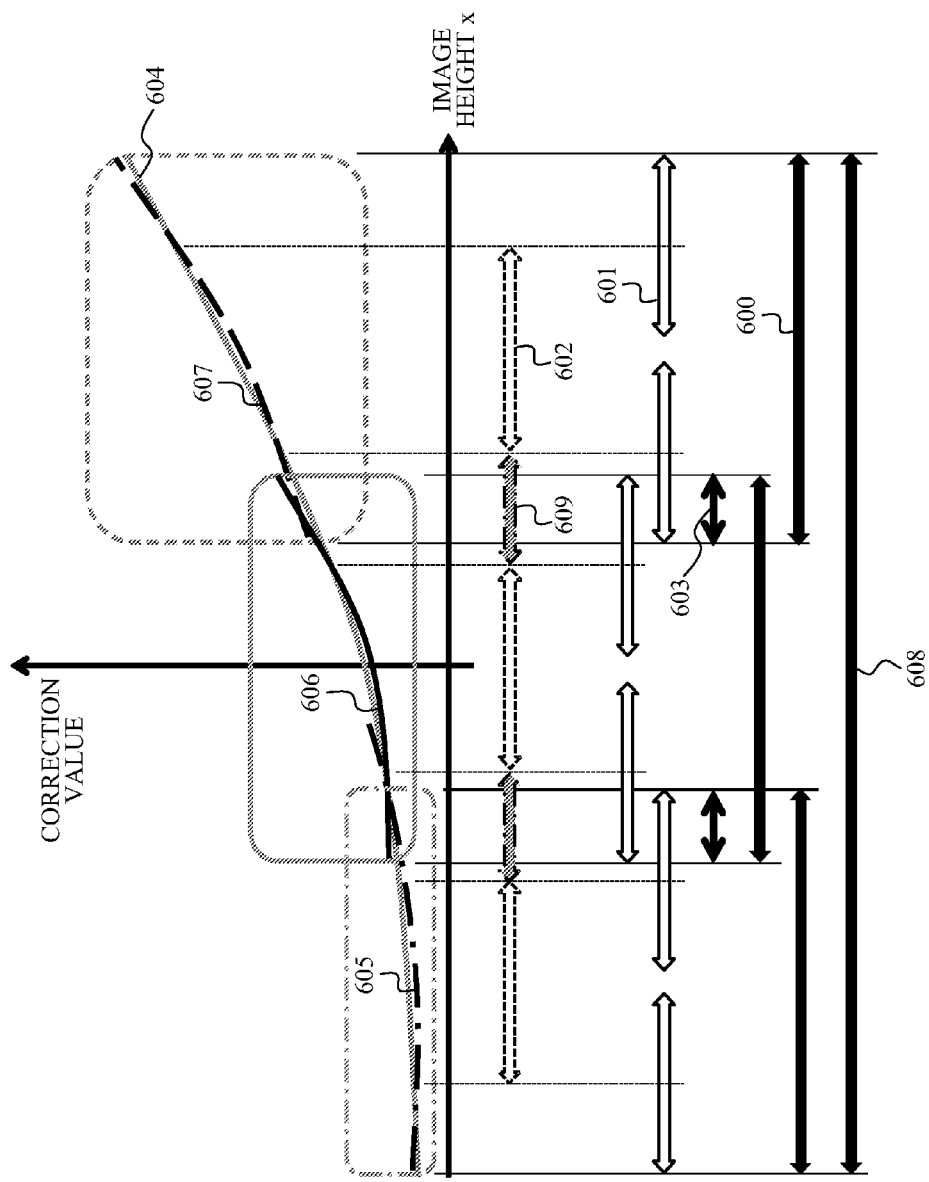

FIGS. 6A and 6B illustrate a case where the image height area is divided into a plurality of approximate areas and each area is approximated by a second-order function. An area p (600) where the correction can be performed at an enough precision and an area (field-of-view length) q (601) where the focus detection is performed are illustrated. An area r (602) where a center of the focus detection area can be set in the correction value applicable area 600 and an area 603 where areas in each of which the approximate function can correct at an enough precision overlap are illustrated. Data 604 before the approximation of the correction value and a correction value 605 in the case where the approximation is performed in an area where the image height x is negative are illustrated. A correction value 606 in the case where the approximation is performed in an area where the image height x is located at a center and a correction value 607 in the case where the approximation is performed in an area where the image height x is positive are illustrated. A whole area L (608) where the correction is performed and an area 609 where when a center of the focus detection field-of-view is set in this area, the correction cannot be performed by one function at an enough precision are illustrated.

When the approximate area is divided and the approximation is performed, it should be noted that it is necessary to set the overlap area 603 so as to be equal to or larger than the field-of-view length 601. In FIG. 6A, since the overlap area 603 is sufficiently assured, even if the center of the focus detection field-of-view is located at any image height, the sufficient correction precision can be derived by using one function. On the other hand, in FIG. 6B, since the overlap area is small, if the center of the focus detection field-of-view is set in the area 609, the sufficient correction precision cannot be assured by using one function. If the focus detection area is divided and a correction value is calculated by using two kinds of functions, they become discontinuous functions. If the image signals are corrected in a state where a discontinuous point exists in the correction value, an edge which does not actually exist is formed and becomes a factor of deterioration of the focus detection precision. It is, therefore, necessary to set the overlap area 603 so as to be equal to or larger than the field-of-view length 601.

When the number N of image height division is decided, it is sufficient that the whole area 602 (=r) where the center of the focus detection field-of-view can be set is set in the correction area 608 (=L). Therefore, it is desirable to set the number N of image height division so as to satisfy the following conditions (5) and (6).

$$N > L/r \quad (5)$$

$$r = p - q \quad (6)$$

Figure 7:
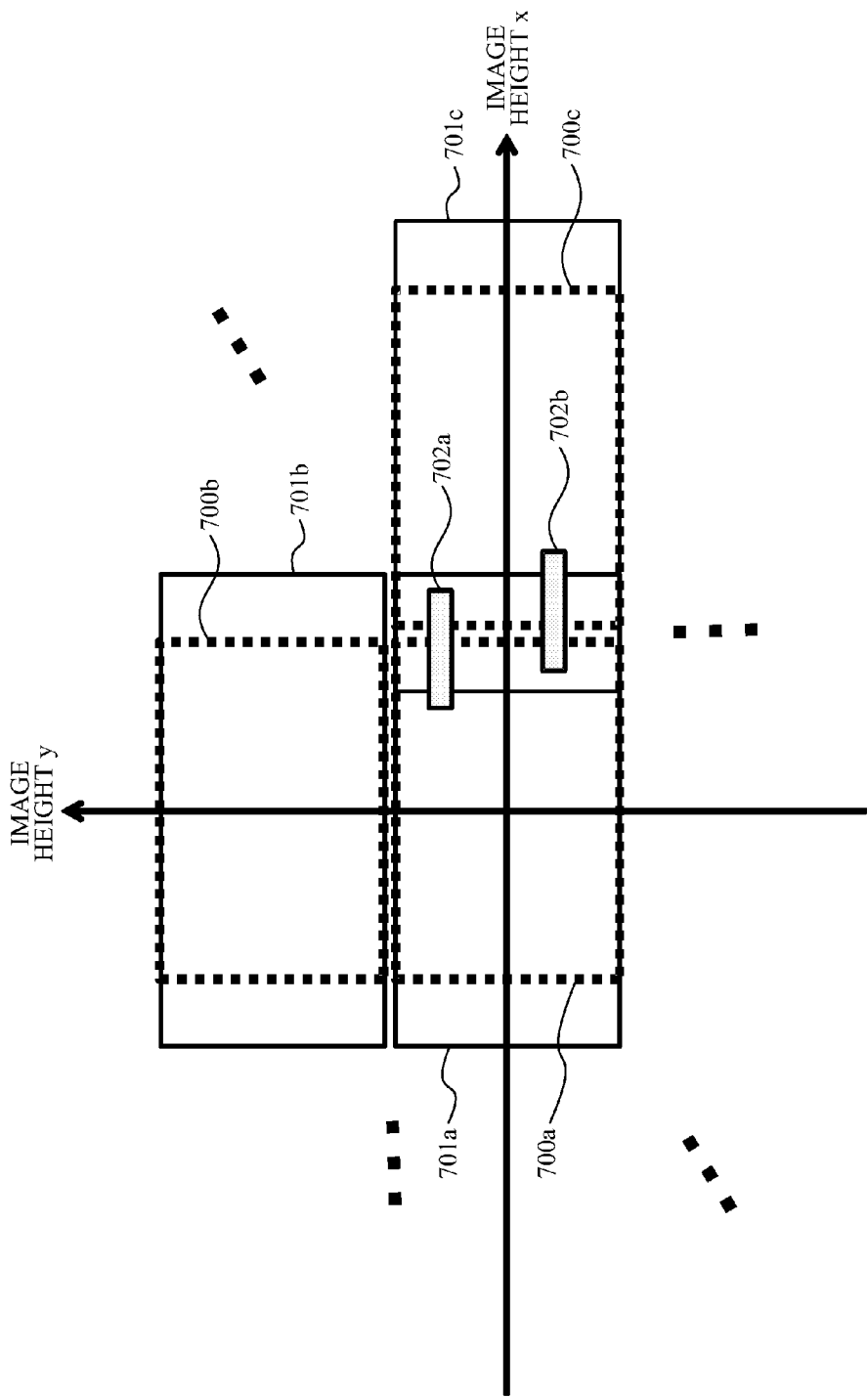
FIG. 7 is a diagram illustrating an example of a division of the whole area of the image pickup element in the case where the correction value calculation coefficients according to the divided area are stored in the first embodiment of the invention.

FIG. 7 illustrates a case where the area is divided so as to satisfy the above expressions (5) and (6), the correction value calculation coefficients are stored, and the correction value is calculated. An area 700 where the same correction value calculation coefficients are applied when the center of the focus detection area lies within this area, an adaptive area 701 of the correction value calculated by using the correction value calculation coefficients of the corresponding area 700, and a focus detection area 702 are illustrated, respectively.

In FIG. 7, in the x direction, as mentioned above, with respect to the correction value, a correction value adaptive area 701a calculated in a correction value calculation coefficient adaptive area 700a and a correction value adaptive area 701b calculated in a correction value calculation coefficient adaptive area 700b are set so as to overlap with each other in an area larger than the focus detection area. On the other hand, in the y direction, there is no need to calculate the correction value in an overlap manner because only the x direction is presumed as a focus detection direction in the present embodiment. Therefore, in the y direction, an overlap area is not set in the correction value adaptive area 701. With respect to the y direction, since an area which uses the same correction value calculation coefficients in common to the x direction is narrow, by considering an influence of the shading in the y direction when correction value calculation coefficients are previously calculated, an operation amount at the time of calculating the correction value can be reduced as shown by the following equation (7).

$$SA'(x) = S0A' + S1A'x + S2A'x^2 \quad (7)$$

$$SB'(x) = S0B' + S1B'x + S2B'x^2 \quad (8)$$

where, S0A', S1A', S2A', S0B', S1B', and S2B' are coefficients of the approximate function calculated by previously considering an influence of the shading change in the y direction, respectively.

As mentioned above, by properly storing the correction value calculation coefficients for every area and calculating the correction value on the basis of the correction value calculation coefficients which are effective in the set focus detection area, a correction precision similar to that of the third-order functions shown in the equations (3) and (4) can be realized by the second-order functions shown in the equations (7) and (8). Thus, the number of times of multiplication can be remarkably reduced from 11 times to 3 times and the operation scale can be decreased.

Since the operation scale for the correction value calculation is decreased, it is estimated that the operation time is shortened, and a high speed of the focus detection can be also expected.

With respect to a setting method of the x direction of the correction value calculation coefficient adaptive range, either a mode in which such a range is equivalently set or a mode in which such a range is inequivalently set can be used so long as the overlap area which is equal to or longer than the field-of-view length can be assured. Also with respect to the y direction, it is not always necessary to equalize a size of area.

As a supplementation of the deciding method of the number N of image height division, if the number of image height division is increased, an amount of data which is stored increases obviously. Therefore, it is necessary to determine the final number of image height division in consideration of the correction precision and the storage amount.

Focus Detection Flow

Figure 8:
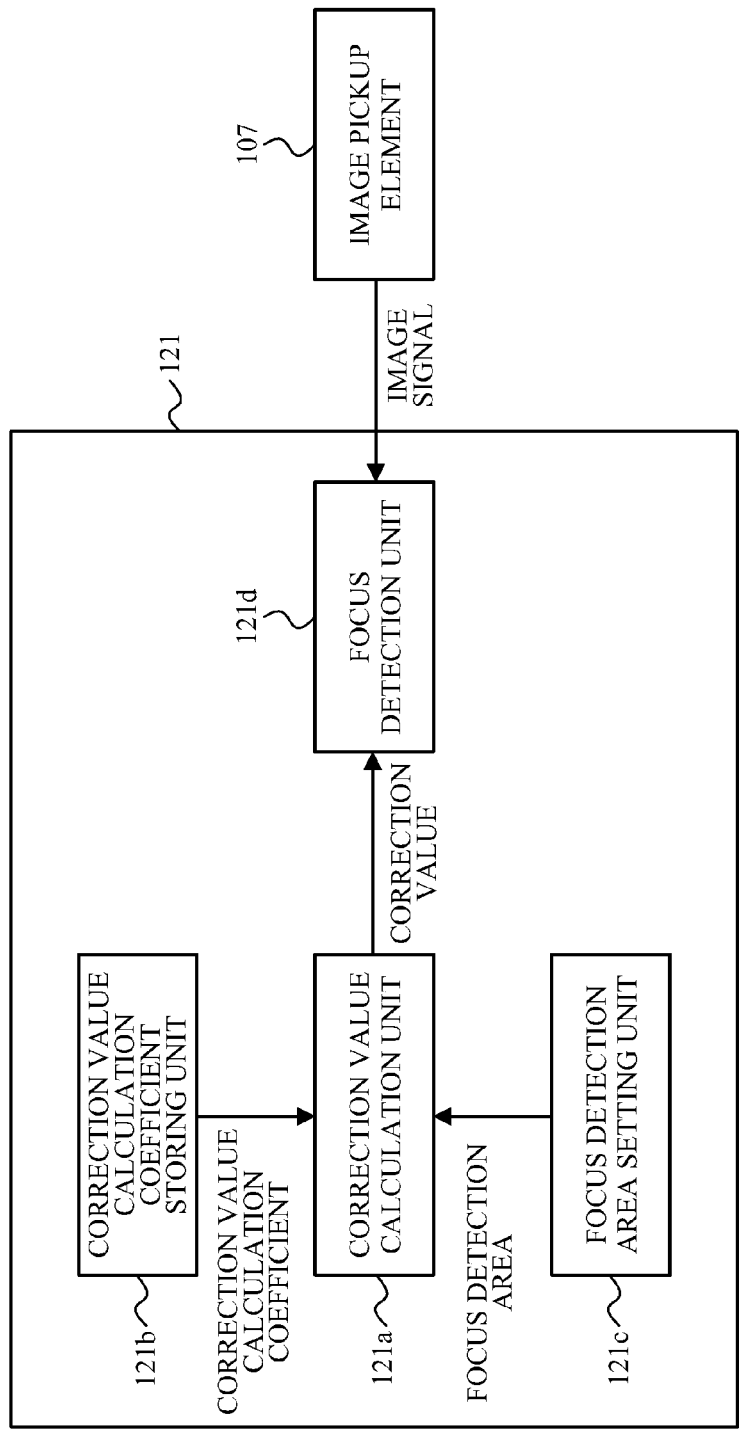
FIG. 8 is a conceptual diagram of a focus detection construction according to the first embodiment of the invention.

FIG. 8 is a diagram conceptually illustrating a focus detection construction according to the embodiment. This construction is realized by a method whereby the CPU 121 executes processings based on a predetermined program stored in the ROM.

First, the image pickup element 107 performs the photographing and sends the obtained image signal to the focus detection unit. Subsequently, the correction value calculating unit 121a obtains proper correction value calculation coefficients from the correction value calculation coefficient storing unit 121b in accordance with the position of the focus detection area selected in the image pickup area by the focus detection area setting unit 121c, calculates the correction value, and sends to the focus detection unit 121d. As a setting method of the focus detection area at this time, the user may previously arbitrarily set it or the camera may automatically set it by an object recognition or the like. When the correction value calculation coefficients are selected, the iris value and the exit pupil distance information are considered. The focus detection unit 121d performs the focus detection by using the received image signal and correction value. An outline of the focus detection construction of the present embodiment is described above.

Figure 9:
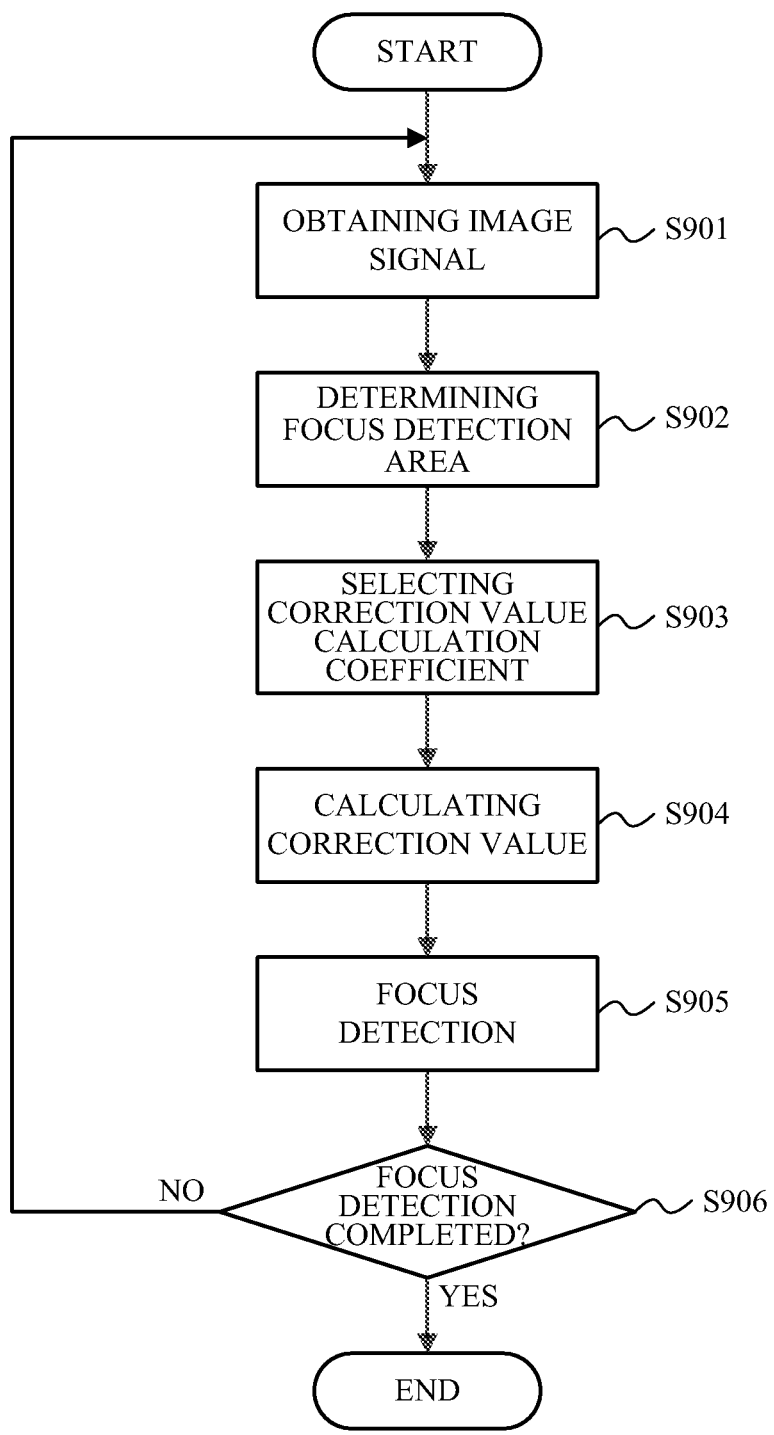
FIG. 9 is a flowchart for the focus detecting operation according to the first embodiment of the invention.

FIG. 9 is a flowchart when the focus detecting operation according to the embodiment is executed by the focus detection construction of FIG. 8.

First, in step 901, the image pickup element 107 obtains the image signal. Subsequently, in step 902, with respect to which area of the obtained image signal the focus detection is performed is discriminated. In step 903, the proper correction value calculation coefficients are selected on the basis of a discrimination result of the focus detection area. In step 904, the correction value is calculated by using the selected correction value calculation coefficients. In step 905, the focus detection is performed by using the calculated correction value and the image signal which is output from the image pickup element 107. The processings of steps 901 to 905 are executed one or more times. In step 906, whether or not the focus detection is finished is discriminated. If it is determined that the focus detection is finished, the focus detecting operation is finished.

According to the embodiment as mentioned above, by storing the limited approximate function (coefficients) every divided area, a correction value is calculated with the approximate function of a lower order at an approximation precision of a similar degree to the approximate function of a higher order and the correction of a high precision can be performed. Thus, the image pickup apparatus which can perform the focus detection of the high precision by the reduced operation scale can be realized.

Second Embodiment

The second Embodiment of the invention will be described with reference to FIGS. 10 and 11. Since a construction of the image pickup apparatus according to the second embodiment is similar to that of the first embodiment, its description is omitted unless otherwise specified. Since the focus detection construction of FIG. 8 is also similar, in the second embodiment, the operation is executed in accordance with a flowchart different from that of the first embodiment as will be described hereinbelow.

In the first embodiment, the limited approximate function of a lower order is obtained and stored (as coefficients thereof) every divided area of the image pickup range. However, the second embodiment uses such a construction that the approximate function of a higher order is stored, the area is limited to the range of the set focus detection area, and an approximate function of a lower order is obtained.

Function of a Lower Order is Re-Derived from the Function of a Higher Order

Figure 10:
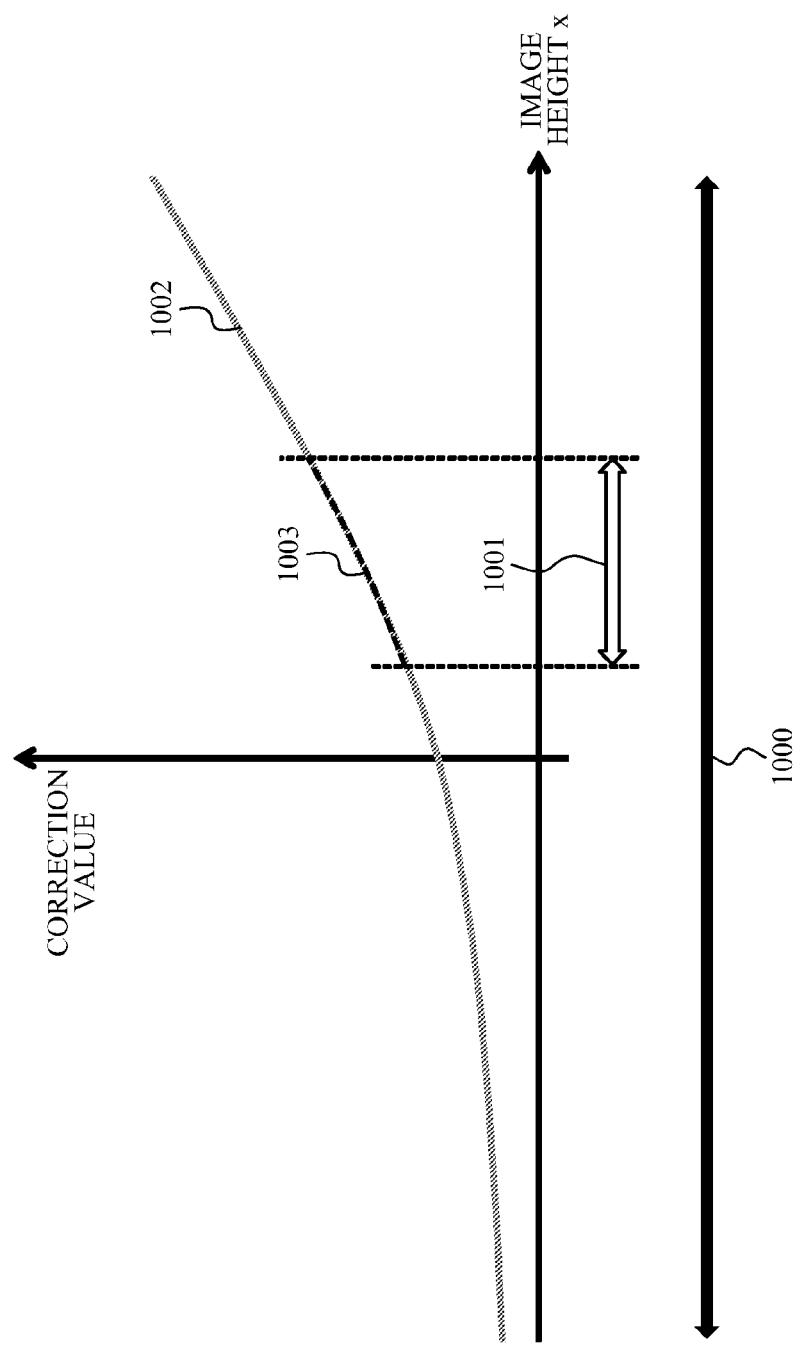
FIG. 10 is a conceptual diagram in the case where the correction value calculation coefficients are limited to a focus detection area and re-derived in accordance with the second embodiment of the invention.

FIG. 10 illustrates a relation between two approximate function at the time when the area is limited to the focus detection area and the function of a lower order is re-deriving from the approximate function of a higher order.

In the diagram, a whole area 1000 where the correction is performed, a focus detection area 1001, an approximate function 1002 of a higher order, and an approximate function 1003 of a lower order which is re-derived by limiting the area to the focus detection area are illustrated.

Even in the case where the function of a higher order is necessary in order to obtain an enough approximation precision by one function in the whole correction area 1000, by limiting the approximation area, the enough approximation precision can be obtained by the function of a lower order. Therefore, in the present embodiment, the correction value calculation coefficients of the function of a higher order are stored, and if the focus detection area is known, then the area is limited to such an area to re-derive the correction value calculation coefficients of the function of a lower order from the function of a higher order by the Taylor expansion or the like, thereby calculating the correction value of an enough approximation precision by the function of a lower order. An nth-order function at the time when a central image height of the focus detection area is equal to $(x_a, y_a)$ is derived from the original approximate function of a higher order (an order is equal to or higher than n+1 order) by the following equations (9) and (10).

$$SA'(x) = \sum_{n=0}^{n} \frac{SA^{(n)}(x - x_a, y_a)}{n!} \qquad (9)$$

$$SB'(x) = \sum_{n=0}^{n} \frac{SB^{(n)}(x - x_a, y_a)}{n!} \qquad (10)$$

where, SA' denotes a correction value which is re-derived from a correction value SA for the image A and SB' denotes a correction value which is re-derived from a correction value SB for the image B. $SA^{(n)}(x-x_a, y_a)$ indicates an nth derivative of SA(x) at the time when the central image height of the focus detection area is equal to $(x_a, y_a)$, and $SB^{(n)}(x-x_a, y_a)$ indicates an nth derivative of $SB(x)$ at the time when the central image height of the focus detection area is equal to $(x_a, y_a)$.

When the function of a lower order is re-derived from the function of a higher order by the equations (9) and (10), y is handled as a constant and the approximate function is obtained by the one-dimensional Taylor expansion of only the x direction. This is because a size of focus detection area in the y direction is small and, in the structure of the image pickup element in the present embodiment, the pupil division is not performed in the y direction and, in the positional relation between the sub pixels and the microlens, there is not an eccentricity as in the x direction, so that the shading change is also small. Therefore, in the present embodiment, in order to reduce the operation amount, the correction value is calculated by using a representative value of the focus detection area in the y direction. In order to calculate the correction value at a further high precision, a two-dimensional Taylor expansion of x and y may be performed.

Even in a case where the pupil division of the image pickup element is effected in two-dimensional x and y directions and focus detection is performed in both horizontal and vertical directions, if the coefficients are derived by lowering the order of the approximate function in one-dimensional focus detection direction by the Taylor expansion or the like, the arithmetic operation amount can be reduced. Naturally, in order to calculate the correction value at a high precision, the function of a lower order may be re-derived by two-dimensionally considering.

As compared with the case of the first embodiment, in the second embodiment, the arithmetic operation amount is slightly increased by an amount corresponding to the arithmetic operation for re-deriving the correction value calculation coefficients. However, after it is re-derived, the arithmetic operation amount can be set to an amount similar to that in the first embodiment, the arithmetic operation amount can be remarkably reduced. In the second embodiment, since there is no need to divide the correction value calculation coefficients for every area of the image pickup element and store, it is more advantageous with respect to a storage capacity as compared with that in the first embodiment. Particularly, it is advantageous in the case where the operator wants to perform the focus detection in the two-dimensional x and y directions.

Focus Detecting Flow

A focus detection construction of the embodiment will be described with reference to FIG. 8. In a manner similar to the first embodiment, this construction is also realized by a method whereby the CPU 121 executes processings based on a predetermined program stored in the ROM.

First, the image pickup element 107 performs the photographing and sends the obtained image signal to the focus detection unit 121d. Subsequently, the correction value calculating unit 121a obtains correction value calculation coefficients from the correction value calculation coefficient storing unit 121b in accordance with the position of the focus detecting area set by the focus detection area setting unit 121c, re-derives correction value calculation coefficients by using values of the obtained correction value calculation coefficients, arithmetically operates a correction value, and sends to the focus detection unit 121d. As a setting method of the focus detection area at this time, the user may previously arbitrarily set it or the camera may automatically set it by an object recognition or the like. When the correction value calculation coefficients are selected, the iris value and the exit pupil distance information are considered. The focus detection unit 121d performs the focus detection by using the received image signal and correction value. An outline of the focus detection construction according to the embodiment is described above.

Figure 11:
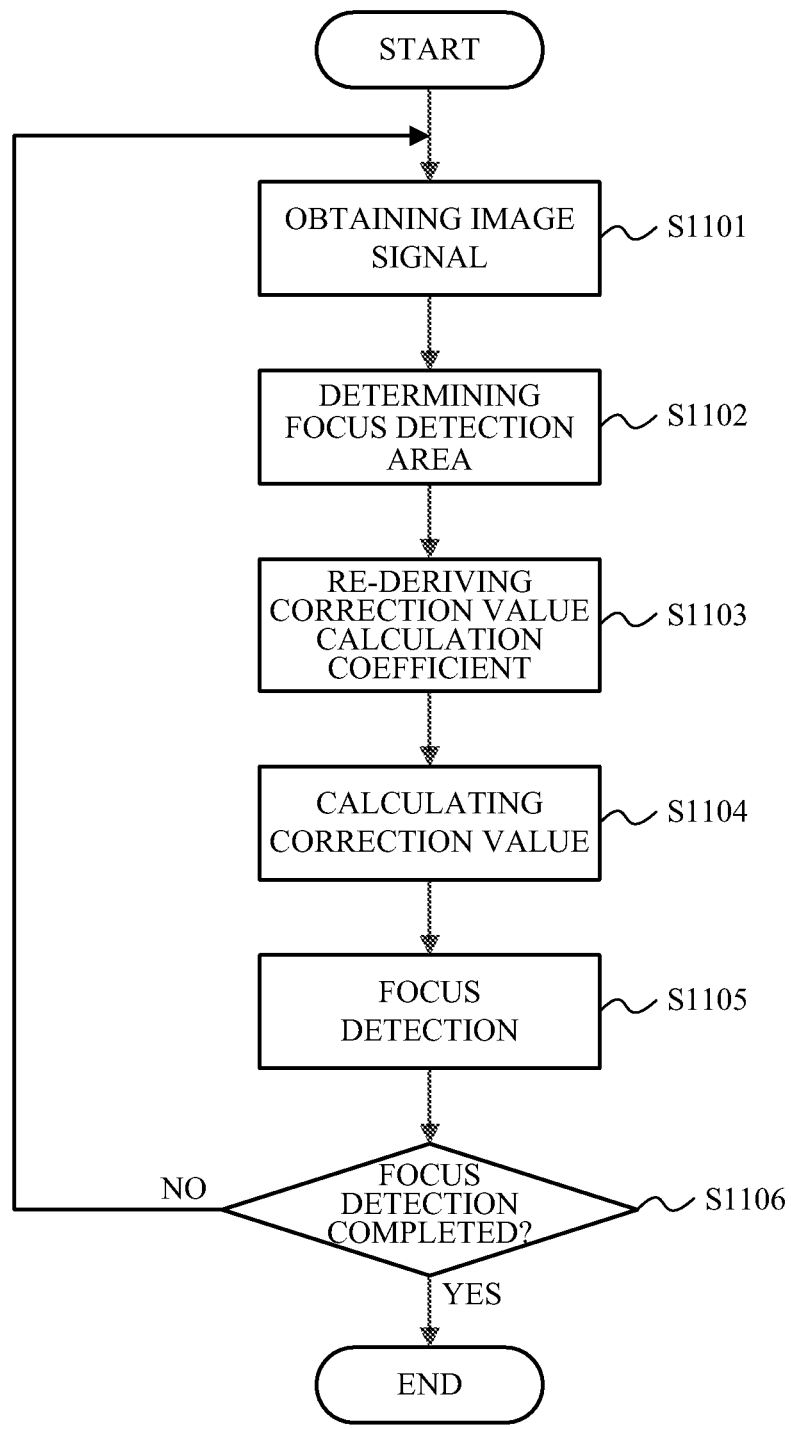
FIG. 11 is a flowchart for the focus detecting operation according to the second embodiment of the invention.

FIG. 11 is a flowchart when the focus detecting operation according to the present embodiment is executed by the focus detection construction of FIG. 8. First, in step 1101, the image pickup element 107 obtains the image signal. Subsequently, in step 1102, with respect to which area of the obtained image signal the focus detection is performed is discriminated. In step 1103, an approximate function of a higher order is obtained from the correction value calculation coefficient storing unit 121b and the correction value calculation coefficients of the approximate function of a higher order are re-derived on the basis of a discrimination result of the focus detection area. In step 1104, the correction value is calculated by using the re-derived correction value calculation coefficients. In step 1105, the focus detection is performed by using the calculated correction value and the image signal which is output from the image pickup element 107. The processings of steps 1101 to 1105 are executed one or more times. In step 1106, whether or not the focus detection is finished is discriminated. If it is determined that the focus detection is finished, the focus detection is finished.

Even by the present embodiment as mentioned above, by calculating the correction value at an approximation precision similar to that of the approximate function of a higher order by the approximate function of a lower order, the correction of a high precision can be performed.

The functions of the processings shown in FIGS. 9 and 11 are realized by a method whereby a program for realizing the functions of the processings is read out of a memory (not shown) and the CPU 121 or the like executes it as mentioned above.

However, the invention is not limited to the foregoing construction but all or a part of the functions of the processings shown in FIGS. 9 and 11 may be realized by dedicated hardware. The foregoing memory may be constructed by a computer-readable/writable recording medium. For example, it may be a non-volatile memory such as magnetooptic disk device, flash memory, or the like, a read only recording medium such as a CD-ROM or the like, a volatile memory other than a RAM, or a recording medium constructed by a combination of them.

The processings shown in FIGS. 9 and 11 may be executed by a method whereby a program for realizing the functions of those processings is recorded into a computer-readable recording medium, the program recorded in the recording medium is read out and stored into a computer system, and is executed. It is assumed that "computer system" mentioned here incorporates an OS and hardware such as peripheral equipment or the like. Specifically speaking, a case where the program which is read out of a storage medium is written into a memory provided for a function expanding board inserted in a computer or a function expanding unit connected to the computer is also incorporated. In this case, after the program is written, a CPU or the like provided for the function expanding board or the function expanding unit executes a part or all of the actual processings on the basis of instructions of the program and the functions of the embodiments mentioned above are realized by those processings.

"computer-readable recording medium" denotes a portable medium such as flexible disk, magnetooptic disk, ROM, CD-ROM, or the like or a storage device such as a hard disk or the like built in the computer system. Further, "computer-readable recording medium" also incorporates a volatile memory (RAM) in the computer system serving as a server or client in the case where the program is transmitted through a network such as Internet or the like or a communication line such as a telephone line or the like. As mentioned above, a medium in which the program is held for a predetermined time is also incorporated in "computer-readable recording medium".

The program mentioned above may be transmitted from the computer system in which the program is stored in a storage device or the like to another computer system through a transmission medium or by a transmission wave in the transmission medium. "transmission medium" for transmitting the program denotes a medium having a function for transmitting information such as network (communication network) like Internet or the like or a communication line (communication wire) like a telephone line or the like.

The foregoing program may be a program for realizing a part of the functions mentioned above. Further, the foregoing program may be what is called a difference file (difference program) in which the foregoing functions can be realized by a combination with a program which has already been recorded in the computer system.

A program product such as a computer-readable recording medium or the like in which the foregoing program is recorded can be also applied as an embodiment of the invention. The foregoing program, recording medium, transmission medium, and program product are incorporated in the purview of the invention.

While the present invention is described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-142083 filed on Jun. 25, 2012, which is hereby incorporated by reference herein in its entirety.

What is claimed is:

1. An image pickup apparatus comprising:
an image sensor configured to generate image signals by respectively photoelectrically converting light passing through different exit pupil areas of a focusing optical system;
a memory configured to store coefficients for a predetermined approximate function for obtaining corre 101 values, wherein the coefficients relate to an iris value and an exit pupil distance; and
at least one processor or one circuitry which function as:
a setting unit configured to set a focus detection area in an image pickup area of the image sensor;
a selector configured to select some of the coefficients frond. the coefficients stored in the rnemoiy in accordance with a position of the focus detection area set by the setting unit;
a correction value obtaining unit configured to obtain a correction value in accordance with the predetermined approximate function and the selected coefficients; and
a focus controller configured to control focusing of the focusing optical system by using the image signals obtained by the image sensor and the correction values obtained by the correction value obtaining unit.

2. An apparatus according to claim 1, wherein the correction value is used for correcting shading.

3. The image pickup apparatus in accordance with claim 1, wherein the predetermined approximate function is determined based on previously calculated correction values for a plurality of conditions.

4. The image pickup apparatus in accordance with claim 1, wherein the memory is configured to store the predetermined approximate function.

5. An image pickup apparatus comprising:
an image sensor having a plurality of micro-lenses and a plurality of photoelectric converting portions each pair of which corresponds to each of the micro-lens especially, wherein the image sensor outputs image signals from the photoelectric converting portions;
a memory configured to store sets of coefficients for predetermined approximate function;
at least one processor or one circuitry which functions as:
a correction information obtaining unit configured to obtain a correction information in accordance with the predetermined approximate function to which coefficients are applied, the coefficients applied to the predetermined approximate function is selected from the coefficients stored in the memory in accordance with a position of a focus detection area set by a setting unit; and
a focus controller configured to control a focus lens by using the image signals obtained from the image sensor and the correction values obtained by the correction information obtaining unit, wherein
each of the sets of the coefficients stored in the memory respectively correspondsto one of a plurality of partial ranges arranged along a predetermined direction, wherein each of the partial ranges is partially overlapped with at least one of adjacent partial ranges, and wherein each focus detection area is respectively included in corresponding one of the partial ranges.

6. An apparatus according to claim 5, wherein the correction information is used for correcting a shading.

7. An apparatus according to claim 5, wherein the predetermined direction corresponds to an image height direction.

8. An apparatus according to claim 5, wherein the predetermined direction corresponds to a direction in which the each pair of photoelectric converting portions are arranged.

9. An apparatus according to claim 5, wherein the correction information is used for correcting shading.

10. An apparatus according to claim 5, wherein the coefficients applied to the approximate function are selected from the coefficients stored in the memory in accordance with the position of the focus detection area and an iris state.

11. An apparatus according to claim 5, wherein the coefficients applied to the predetermined approximate function are selected from the coefficients stored in the memory in accordance with the position of the focus detection area and a pupil distance.

12. An apparatus according to claim 5, wherein the predetermined direction corresponds to a direction in which the pair of photoelectric converting portions are arranged.

13. An image pickup apparatus having a plurality of focus detection areas, comprising:
an image sensor for generating parallax image signals;
a memory configured to store sets of coefficients for predetermined approximate function, wherein each of the sets of the coefficients corresponds to one of a plurality of partial ranges arranged along a predetermined direction, and wherein each of the plurality of focus detection areas respectively corresponds to one of the partial ranges;
at least one processor or one circuitry which functions as:
a correction information obtaining unit configured to obtain a correction information in accordance with the predetermined approximate function to which coefficients are applied, wherein the coefficients applied to the predetermined approximate function are selected from the coefficients stored in the memory in accordance with a position of the focus detection ea set by a setting unit, and a focus controller configured to control a focus lens by using the parallax image signals obtained from the image sensor and the correction information obtained by the correction information obtaining unit.

14. An apparatus according to claim 13, wherein the each of the plurality of focus detection areas is respectively included in corresponding one of the partial ranges.

15. An apparatus according to claim 13, wherein he predetermined direction corresponds to an image height direction.

16. An apparatus according to claim 13, wherein the predetermined direction corresponds to a direction in which the each pair of photoelectric-converting portions arranged.

17. An apparatus according to claim 13, wherein each of the partial ranges is partially overlapped with at least one of adjacent partial ranges.

18. An apparatus according to claim 13, wherein the coefficients applied to the predetermined approximate function are selected from the coeffcients stored in the memory in accordance with the position of he focus detection area and an iris state.

19. An apparatusaccording to claim 13, wherein the coefficients applied to the predetermined approximate function are selected from the coefficients stored in the storing unit in accordance with the position of the focus detection area and a pupil distance.

20. An apparatus according to claim 13, wherein the predetermined direction corresponds to a direction in which parallax images are formed.

21. An image pickup apparatus having a plurality of focus detection areas, comprising:

an image sensor for receiving a light through a focus lens and for generating parallax image signals;

a memory configured to store sets of approximate functions which includes coefficients, wherein each of the ets of the approximate functions sponds to one of a plurality of partial ranges arranged along a predetermined direction, and wherein each of the plurality of focus detection areas respectively corresponds to one of the partial ranges;

a correction information obtaining unit configured to obtain a correction information in accordance with one of the approximate function selected from the approximate functions stored in the memory, in accordance with a position of the focus detection area set by a setting unit; and a controller configured to control the focus lens by using the parallax image signals obtained from the image sensor and the correction information obtained by the correction information obtaining unit.

22. An apparatus according to claim 21, wherein each of the partial ranges is partially overlapped with at least one of adjacent partial ranges.

* * * * *